(12) United States Patent
Tomita

(10) Patent No.: US 7,073,085 B2
(45) Date of Patent: Jul. 4, 2006

(54) SEMICONDUCTOR CIRCUIT DEVICE

(75) Inventor: Seiichi Tomita, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 374 days.

(21) Appl. No.: 10/610,573

(22) Filed: Jul. 2, 2003

(65) Prior Publication Data

US 2005/0005182 A1    Jan. 6, 2005

(30) Foreign Application Priority Data

Jul. 2, 2003    (JP) .............................. 2002-193391

(51) Int. Cl.
*G06F 13/14*    (2006.01)
(52) U.S. Cl. .................. 713/400; 713/401; 713/500; 713/501; 713/802; 713/503; 713/600; 713/601
(58) Field of Classification Search ................ 713/400, 713/401, 500–503, 600, 601
See application file for complete search history.

(56) References Cited

U.S. PATENT DOCUMENTS

| | | | | |
|---|---|---|---|---|
| 4,866,740 A | * | 9/1989 | Iijima | ........................... 377/47 |
| 5,880,644 A | * | 3/1999 | Schmidt et al. | ............. 332/109 |
| 5,933,058 A | * | 8/1999 | Pinto et al. | .................... 331/17 |
| 6,393,088 B1 | * | 5/2002 | Emineth et al. | ............... 377/20 |
| 6,404,840 B1 | * | 6/2002 | Sindalovsky | .................. 377/48 |
| 6,409,301 B1 | * | 6/2002 | Takata et al. | .................. 347/19 |
| 6,567,494 B1 | * | 5/2003 | Stehle | .......................... 377/47 |
| 6,828,848 B1 | * | 12/2004 | Lee | ............................. 327/534 |
| 2005/0018800 A1 | * | 1/2005 | Hsiao | ......................... 375/375 |

FOREIGN PATENT DOCUMENTS

| | | |
|---|---|---|
| JP | 63-200081 | 8/1988 |
| JP | 2-67613 | 3/1990 |
| JP | 6-112810 | 4/1994 |
| JP | 6-82310 | 10/1994 |
| JP | 10-198457 | 7/1998 |

* cited by examiner

*Primary Examiner*—A. Elamin
(74) *Attorney, Agent, or Firm*—Oblon, Spivak, McClelland, Maier & Neustadt, P.C.

(57) ABSTRACT

To provide a semiconductor circuit device including a synchronous frequency divider which counts input clock signals and outputs a counted value, a selector circuit which receives signals of bits of the counted value output from the synchronous frequency divider and outputs a carry lookahead signal of predetermined bits as an operation-processing effective-state signal in accordance with a selector signal, and an integrated circuit portion which uses a clock signal input to the synchronous frequency divider as a source clock and whose operating frequency is switched in accordance with the operation-processing effective-state signal.

12 Claims, 9 Drawing Sheets

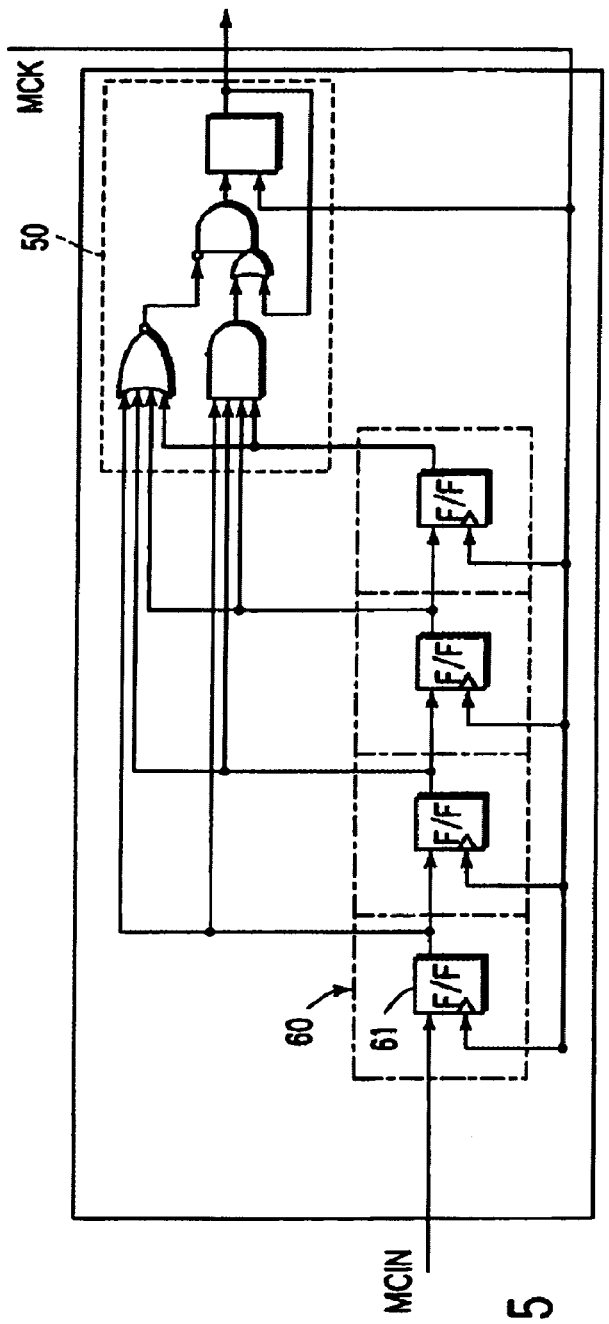
F I G. 5
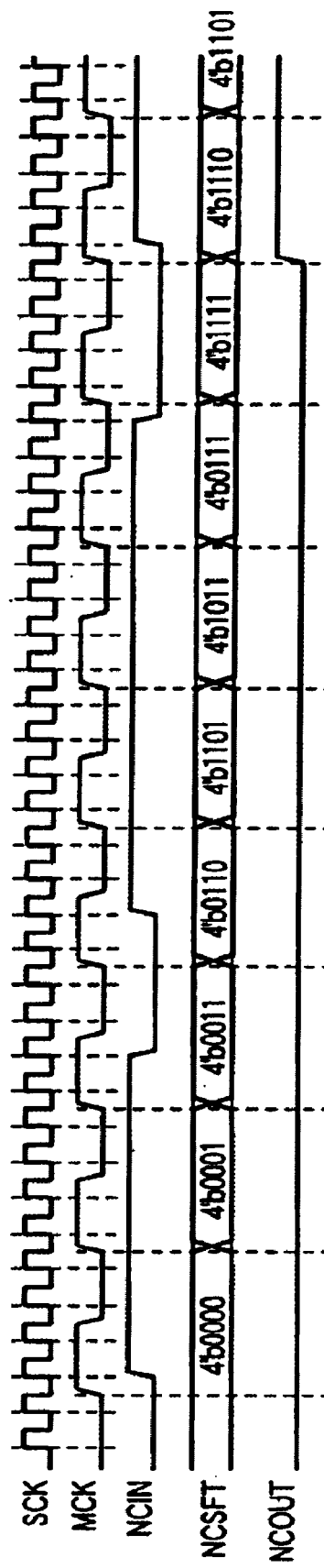
F I G. 6

SEMICONDUCTOR CIRCUIT DEVICE

CROSS-REFERENCE TO RELATED APPLICATIONS

This application is based upon and claims the benefit of priority from the prior Japanese Patent Application No. 2002-193391, filed Jul. 2, 2002, the entire contents of which are incorporated herein by reference.

BACKGROUND OF THE INVENTION

1. Field of the Invention

The present invention relates to a semiconductor circuit device including an integrated circuit portion having an operating-frequency switching function.

2. Description of the Related Art

Semiconductor circuit devices such as a timer, a noise canceller, an SIO, and a UART have a function for switching operation processing frequencies (resolutions). A semiconductor circuit device having the function for switching operation processing frequencies is described below by referring to FIG. 13.

A signal obtained by noise-canceling a signal DVCK frequency-divided by a frequency divider 131 or an event signal EXCK input from the outside of a semiconductor chip by a digital noise canceller 132 is selected by a multiplexer 133 and used as a source clock MCK of an integrated circuit portion 135 whose operating frequency must be switched.

For example, FIG. 14 shows an operation timing chart when selecting ¼ of the source clock SCK as the operating frequency of the integrated circuit portion 135, A signal frequency-divided to ¼ of the source clock SCK by the multiplexer 133 is selected as the source clock MCK of the integrated circuit portion 135. The integrated circuit portion 135 operates (ACT) every cycle of the source clock MCK.

The prior art has a problem that it is necessary to use sync-adjusting portions such as a block 134 for sync-adjusting the interface between a block which synchronizes with the source clock SCK of the frequency divider 131 or multiplexer 133 and the integrated circuit portion 135 which is synchronizes with the source clock MCK and a block 136 for synch-adjusting the interface between a block which synchronizes with a clock ACK asynchronous with the source clock SCK and the integrated circuit portion 135.

That is, it is a problem that the response time to the signal SCK or ACK is controlled by the frequency of the signal MCK. Moreover, it is one of problems that there is a use restriction that the operating frequency (source clock of the MCK of the integrated circuit portion 135) cannot be switched during the processing operation of the integrated circuit portion 135 because whiskers may appear on the signal MCK.

As described above, there is a problem that a synch-adjusting portion is necessary because of performing sync-adjustment between a clock signal input to the frequency divider and a clock signal input to the integrated circuit portion.

BRIEF SUMMARY OF THE INVENTION

A semiconductor circuit device of the present invention comprises a synchronous frequency divider for counting input clock signals and outputting a counted value, a selector circuit for receiving the signal of each bit of the counted value output from the synchronous frequency divider and outputting a signal for reading the carry look-ahead signal of a certain bit as an operation processing effective-state signal in accordance with a selector signal, and an integrated circuit portion for switching operating frequencies in accordance with the operation-processing effective-state signal by using a clock signal input to the synchronous frequency divider as a source clock.

The semiconductor circuit device of the present invention comprises a synchronous frequency divider for counting input clocks and outputting a counted value, a selector circuit for comparing the counted value of the frequency divider with a set value and outputting the comparison result as an operation-processing effective-state signal in accordance with a selector signal, and an integrated circuit portion for switching operating frequencies in accordance with the operation-processing effective-state signal by using a clock signal input to the synchronous frequency divider as a source clock.

BRIEF DESCRIPTION OF THE SEVERAL VIEWS OF THE DRAWING

FIG. 5 is a block diagram showing a schematic configuration of a conventional noise canceller;

FIG. 6 is an illustration showing an operation timing chart of the noise canceller shown in FIG. 5;

DETAILED DESCRIPTION OF THE INVENTION

Embodiments of the present invention will be described below by referring to the accompanying drawings.

FIRST EMBODIMENT

Figure 1:
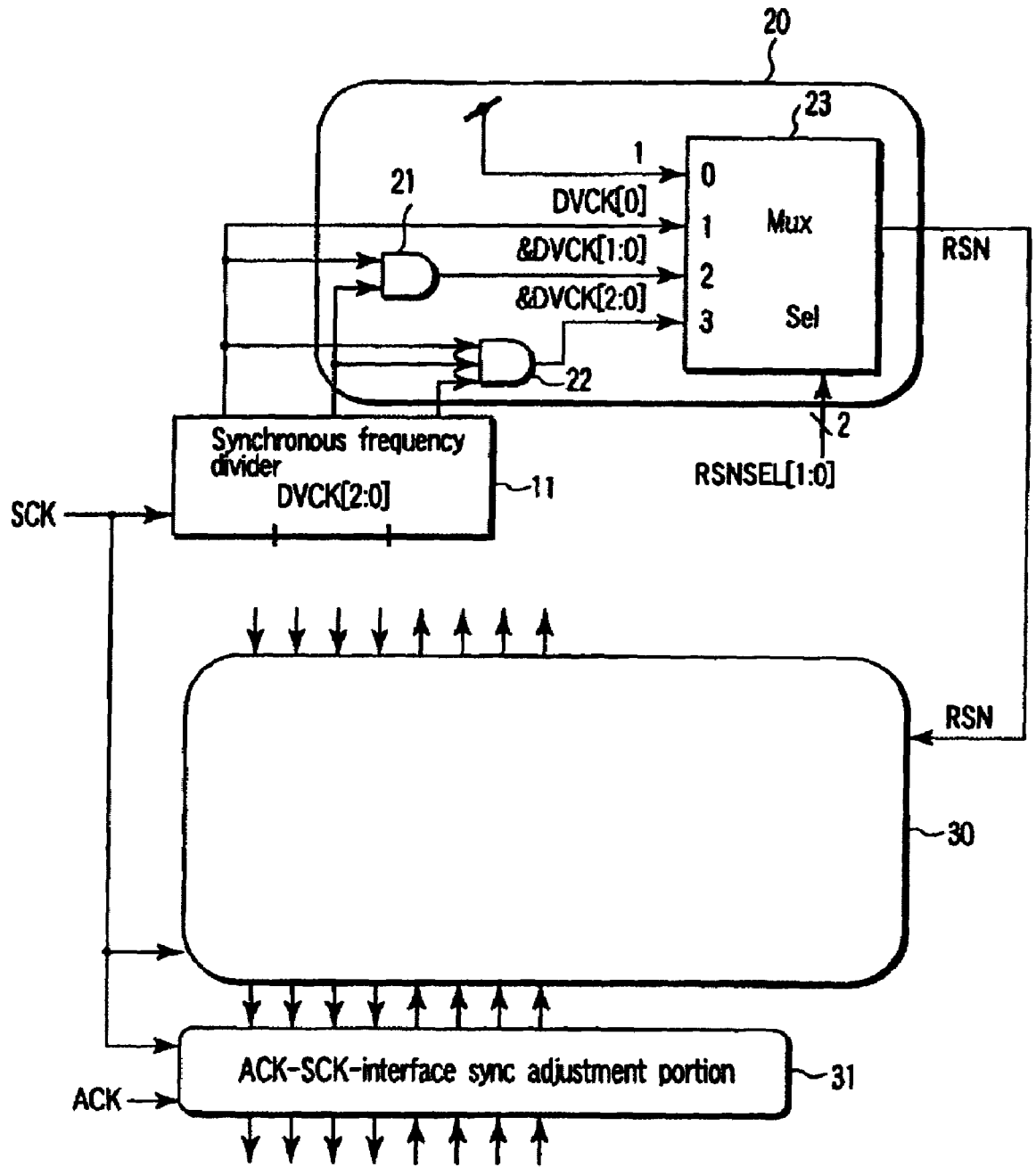
FIG. 1 is a block diagram showing a schematic configuration of one-chip microcomputer of a first embodiment.

FIG. 1 is a block diagram showing a schematic configuration of the one-chip microcomputer of the first embodiment of the present invention.

The input source clock signal SCK is input to a synchronous frequency divider 11, an integrated circuit portion 30, and an interface sync-adjustment portion 31.

The synchronous frequency divider 11 counts rises of input source clocks SCK. In a counted value, signals of bits are output in parallel as 3-bit digital data. When the synchronous frequency divider 11 counts eight rises, a counted value is reset.

The signal of each bit of the counted value is input to a selector circuit 20. The signal DVCK[0] of a first bit of the counted value is input to a multiplexer 23, a first AND circuit 21, and a second AND circuit 22. A second bit signal of the counted value is input to the first AND circuit 21 and the second AND circuit 22. The third bit signal of the counted value is input to the second AND circuit 22. Output signals &DVCK[1:0] and &DVCK[2:0] are input to the multiplexer 23. Moreover, a signal "1" which is always active is input to the selector circuit 20.

The signals DVCK[0], &DVCK[1:0], and &DVCK[2:0] are carry look-ahead signals which become active before each bit of the counted value is carried.

The carry look-ahead signal DVCK[0] of the first bit of the counted value input to the multiplexer becomes active for one cycle of the source clock SCK every two cycles of the source clock SCK. The carry look-ahead signal &DVCK[1:0] of the second bit of the counted value becomes active for one cycle of the source clock SCK every four cycles of the source clock. The carry look-ahead signal &DVCK[2:0] of the second bit of the counted value becomes active for one cycle of the source clock SCK every eight cycles of the source clock SCK.

A frequency selecting-encoding signal RSNSEL is input to the multiplexer 23. The multiplexer 23 outputs any one of the signals DVCK[0], &DVCK[1:0], and &DVCK[2:0] as an operation-processing effective-state signal RSN in accordance with the frequency selecting-encoding signal RSNSEL.

Figure 2:
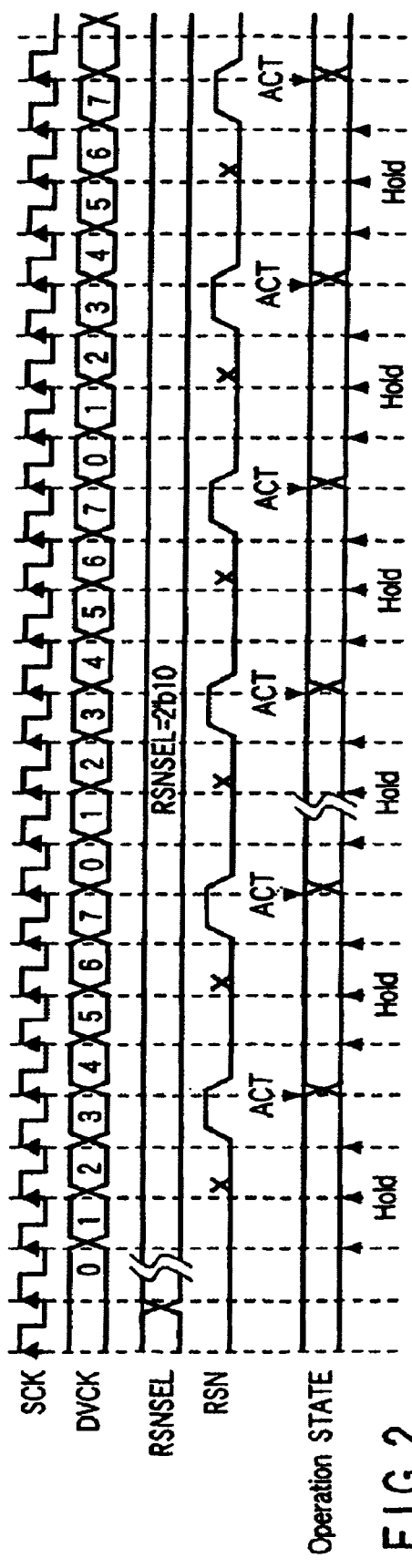
FIG. 2 is an illustration showing an operation timing chart when selecting ¼ of the source clock SCK as an operating frequency of an integrated circuit portion 30.

The following description is made by assuming that a selecting signal RSNSEL[1:0] for selecting ¼ frequency of a source clock is input. FIG. 2 shows an operation timing chart when assuming one cycle of the source clock SCK as one state and selecting ¼ of the source clock SCK as the operating frequency of the integrated circuit portion 30. The operation-processing effective-state signal RSN output from the selector circuit 20 becomes active only for one of four cycles of the source clock.

The multiplexer 23 supplies the signal &DVCK[1:0] output from the first AND circuit 21 to the integrated circuit portion 30 whose operating frequency must be switched as an operation-processing effective-state signal RSN (Resolution).

Though the integrated circuit portion 30 basically performs operation processing at cycle of the source clock SCK, a block which must be operated at ¼ frequency of the source clock SCK performs operation processing in accordance with a state signal in which the signal RSN becomes active.

The clock signal ACK asynchronous with the source clock SCK and the source clock SCK are input to the ACK-SCK interface sync-adjustment portion 31. The interface sync-adjustment portion 31 sync-adjusts the clock signal ACK and source clock SCK.

Figure 4:
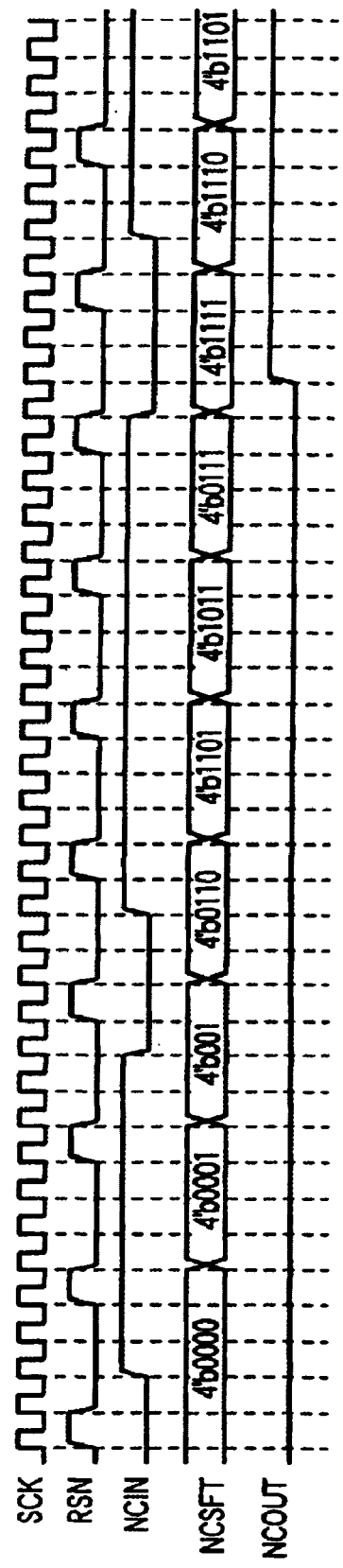
FIG. 4 is an illustration showing an operation timing chart of the noise canceller shown in FIG. 3.
Figure 3:
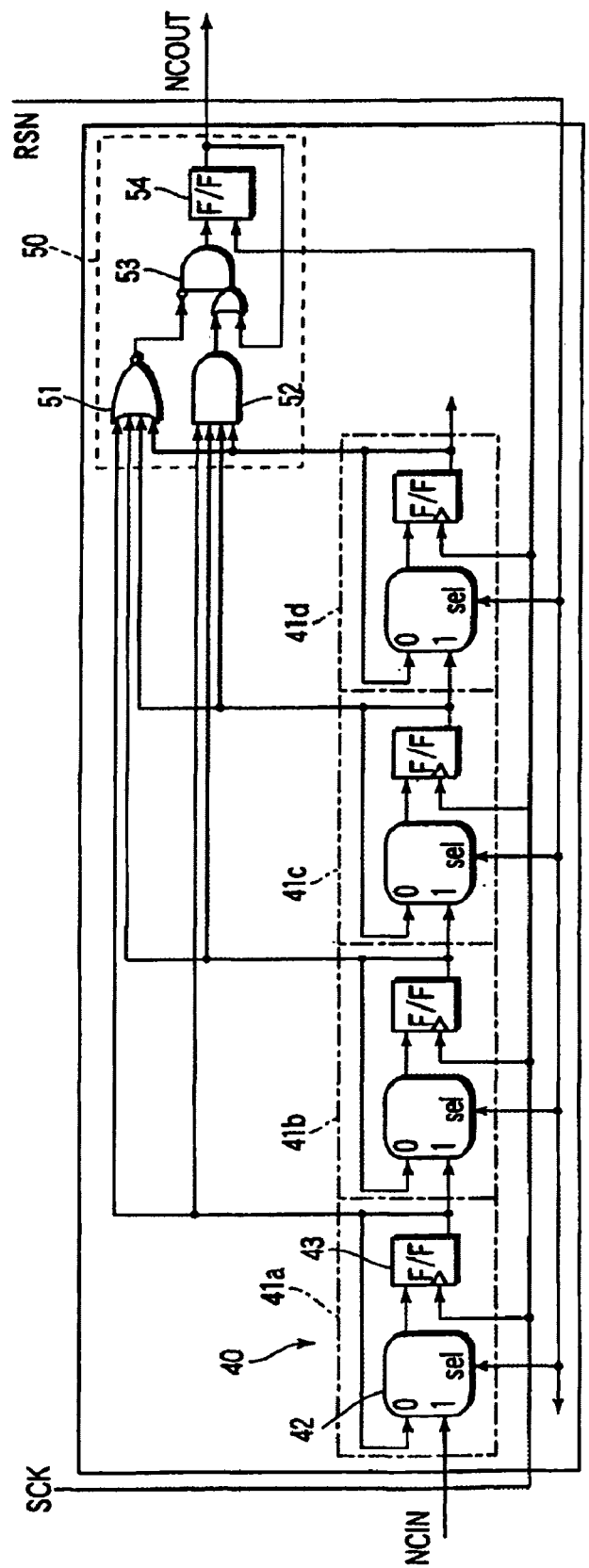
FIG. 3 is a block diagram showing a schematic configuration of a noise canceller of the first embodiment.

Then, operations according to the signal RSN will be described below by using a specific integrated circuit portion. FIG. 3 shows the integrated circuit portion 30. The integrated circuit portion shown in FIG. 3 is a noise canceller for switching sampling cycles in accordance with the signal RSN by setting the sampling number to 4 times. Moreover, FIG. 4 shows an operation timing chart of the noise canceller.

An external signal NCIN, the source clock SCK, and the operation-processing effective-state signal RSN are input to the noise canceller.

A four-bit shift register 40 provided with operating-frequency selection is constituted by connecting four registers 41 (41a, 41b, 41c, and 42d) in series by four bits. Each register 41 is constituted by an operating-frequency selecting circuit 42 and a D-type flip-flop (F/F) 43. The four-bit shift register 40 shifts the external signal NCIN one bit by one bit when the operation-processing effective-state signal RSN is kept in the active state "High".

Specifically, when the operation-processing effective-state signal RSN is active, the operating-frequency selecting circuit 42 in the register 41 transfers the external input signal NCIN or a signal output from the flip-flop 43 of the front-stage shift register 41 to the flip-flop 43 in the same register 41. Moreover, when the operation-processing effective-state signal RSN is inactive, the operating-frequency selecting circuit 42 directly outputs a signal output from the flip-flop 43 in the same register 41 to the same flip-flop 43. That is, the operating-frequency selecting circuit 42 switches a signal to be output to the flip-flop 43 in accordance with the operation-processing effective-state signal RSN.

The flip-flop 43 is operated in accordance with the source clock SCK. However, the external input signal NCIN or the signal from the front-stage register can be input only when the operation-processing effective-state signal RSN is active. Therefore, the four-bit shift register 40 operates in the same manner as that of operating in accordance with the input cycle of the operation-processing effective-state signal RSN.

The four-bit shift register 40 is different from a conventional noise canceller in circuit configuration but the configuration of the subsequent sampling circuit 50 is the same as that of the conventional noise canceller. The sampling circuit 50 is constituted by gate circuits 51, 52, and 53 and a D-type flip-flop.

Only when signals input to the registers 41 of the four-bit shift register 40 all become "0", a noise-cancelled signal NCOUT output from the sampling circuit 50 becomes "0". As a result, the low level of the external input signal NCIN is detected.

Moreover, when values stored in the register 41 of the four-bit shift register are all "1", the noise-cancelled signal NCOUT output from the sampling circuit 50 becomes "1". As a result, the high level of the external input signal NCIN is detected.

When values stored in the registers 41 of the four-bit shift register 40 are all kept at values other than "0" or "1", the value of the previous noise-cancelled signal NCOUT output is held and output.

Thereby, because the integrated circuit portion 30 synchronizes with the source clock SCK, a circuit portion is not necessary which sync-adjusts the interface between an integrated circuit portion synchronizing with the source clock SCK and the integrated circuit portion 30. Moreover, it is possible to switch operating frequencies while the integrated circuit portion 30 executes processing operations.

Moreover, in order to sync-adjust the interface between an integrated circuit portion synchronizing with the clock ACK which is asynchronous with the source clock SCK and the integrated circuit portion 31, sync with the source clock SCK is realized by the block 51. Therefore, the response time is constant because it depends on only the frequency of the source clock SCK but it is not influenced by a selected operating frequency. Particularly, a large advantage is obtained that the response for an instruction from a processor becomes constant.

FIG. 5 shows a block diagram of a conventional noise canceller. FIG. 6 shows an operation timing chart of the noise canceller. As shown in FIG. 5, a four-bit shift register 60 is constituted by connecting D-type flip-flops 61 in series by four bits.

As shown in FIG. 6, a temporal shift occurs between the source clock SCK and a clock MCK obtained by frequency-dividing the source clock SCK. Therefore, sync adjustment must be performed and the response of the signal NCOUT which is a noise cancelled result depends on the clock MCK.

SECOND EMBODIMENT

In this embodiment, a selector circuit is shown. Because configurations other than the selector circuit are the same as those of the one-chip microcomputer described in the first embodiment, only the selector circuit and a synchronous frequency divider will be illustrated and explained.

Figure 7:
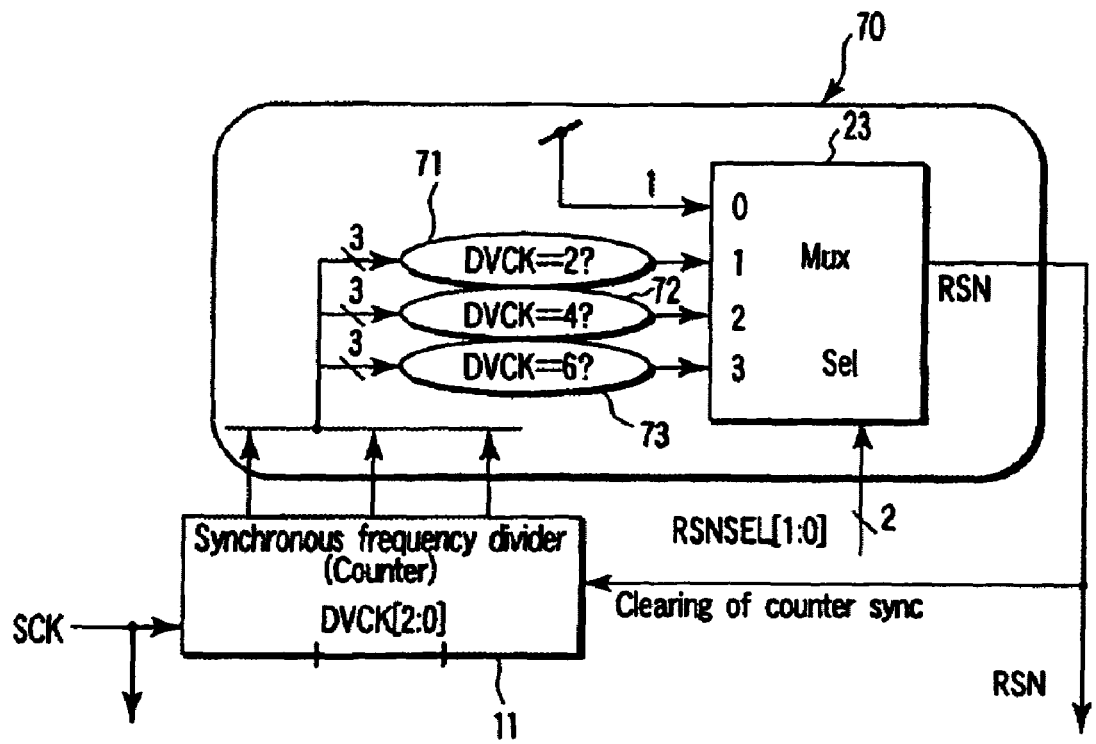
FIG. 7 is a block diagram showing a schematic configuration of a one-chip microcomputer of a second embodiment.

FIG. 7 is a block diagram showing a schematic configuration of a one-chip microcomputer of the second embodiment of the present invention.

A counted value by the synchronous frequency divider 11 is input to first, second, and third counted-value detection circuits 71, 72, and 73 in a selector circuit 70. A signal output from the first counted-value detection circuit 71 becomes active when a counted value becomes 3 (DVCK[2:0]=2). Therefore, a signal output from the first counted-value detection signal 71 becomes active at a ⅓ frequency of the source clock SCK. Moreover, a signal output from the second counted-value detection circuit 72 becomes active when a counted value becomes 5 (DVCK[2:0]=4). Therefore, a signal output from the second counted-value detection circuit 72 becomes active at a ⅕ frequency of the source clock SCK. Moreover, a signal output from the third counted-value detection circuit 73 becomes active when a counted value becomes 7 (DVCK[2:0]=6). Therefore, a signal output from the third counted-value detection circuit 73 becomes active at a ⅐ frequency of the source clock SCK.

Signals of the counted-value detection circuits 71, 72, and 73 are input to a multiplexer 23. The multiplexer 23 outputs any one of output signals of the counted-value detection circuits 71, 72, and 73 as an operation-processing effective-state signal RSN in accordance with a selecting signal RSNSEL.

The operation-processing effective-state signal RSN (Resolution) is supplied to the integrated circuit portion 30 whose operating frequency must be switched and the synchronous frequency divider 11. When the operation-processing effective-state signal RSN is input, the synchronous frequency divider 11 resets a counted value.

In this embodiment, it is possible to select frequency division of integers other than factorial of 2 such as ⅕ of a source clock serving as an operating frequency.

THIRD EMBODIMENT

Figure 8:
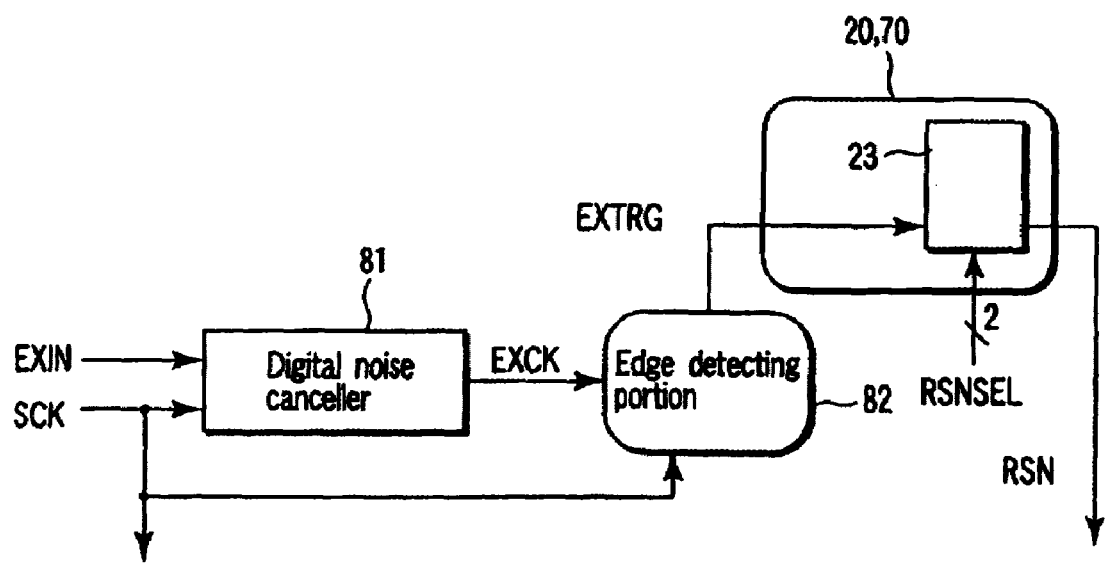
FIG. 8 is a block diagram showing a schematic configuration of a one-chip microcomputer of a third embodiment.

In this embodiment, signals further supplied to the operating-frequency selector circuits 20 and 70 described in the first and second embodiments will be described. FIG. 8 is a block diagram showing a schematic configuration of a one-chip microcomputer of the third embodiment of the present invention. Because the configuration of the one-chip microcomputer of this embodiment is the same as the configuration of the one-chip microcomputer shown in FIG. 1, only main parts are described below.

As shown in FIG. 8, the following are included: a noise canceller 81 to which an event signal EXIN and source clock SCK are input and an edge detecting portion 82 to which a signal EXCK and the source clock SCK are input from the noise canceller 81.

The event signal EXIN is a signal such as an external terminal input, which is supplied from the outside of an integrated circuit portion. The noise canceller 81 cancels noises of the event signal EXIN synchronously with the source clock SCK. The edge of the signal EXCK whose noises are cancelled by the noise canceller 81 is detected by the edge detecting portion 82. When detecting the edge of the signal EXCK, the edge detecting portion 82 outputs an edge-detection state signal EXTRG which becomes active for one cycle of the source clock SCK to the operating-frequency selector circuits 20 and 70. The operating-frequency circuits 20 and 70 output an operation-processing effective-state signal RSN in accordance with an input selecting signal RSNSEL.

FOURTH EMBODIMENT

Figure 9:
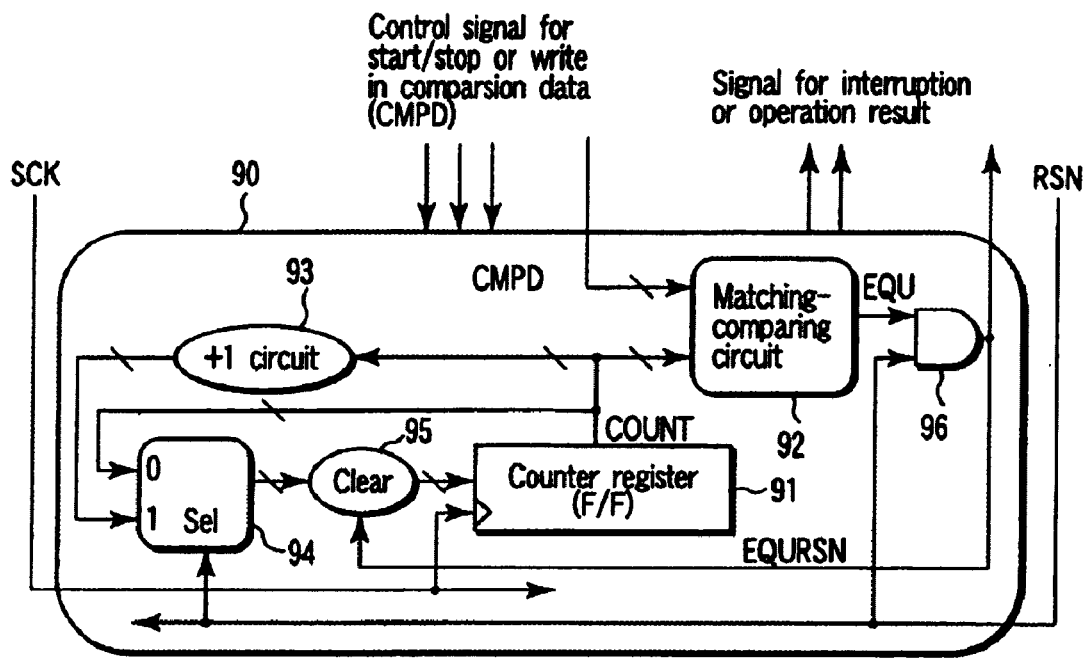
FIG. 9 is a block diagram showing a schematic configuration of a timer of a fourth embodiment.

FIG. 9 shows an embodiment applied to a timer as an integrated circuit portion 30 having an operating-frequency selecting function.

A source clock SCK is input to a counter register 91 constituted by a flip-flop from the outside of a timer 90. The counter register 91 is operated in accordance with a source clock SCK. A signal COUNT output from the counter register 91 is input to sides "0" of a matching-comparing circuit 92, +1 circuit 93, and signal-operating-frequency selecting circuit 94.

The +1 circuit 93 adds 1 to an input value and outputs the input value added with 1. An output signal of the +1 circuit is input to the side "1" of the signal-operating-frequency selecting circuit 94. An operation-processing effective-state signal RSN is input to the signal-operating-frequency selecting circuit 94. When the operating-processing effective-state signal RSN is active, the signal-operating-frequency selecting circuit 94 outputs a signal input to the side "1". When the operation-processing effective-state signal RSN is inactive, the signal-operating-frequency selecting circuit 94 outputs a signal input to the side "0". A signal output from the signal-operating-frequency selecting circuit 94 is input to the counter register 91 through a clear circuit 95. Therefore, a signal counted up by the +1 circuit 93 is input to the counter register 91 only when the operation-processing effective-state signal RSN is active.

The matching-comparing circuit 92 compares a signal input from the counter register 91 with a comparison data signal CMPD. When these two signals are matched, a signal EQU output from the matching-comparing circuit 92 becomes active.

The signal EQU and the operation-processing effective-state signal RSN are input to an AND circuit 96. When the signal EQU and the operation-processing effective-state signal RSN are active, a signal EQURSN output from the AND circuit becomes active.

The signal EQURSN is input to the clear circuit 95. When the signal EQURSN is active, the clear circuit 95 clears a signal input from the signal-operating-frequency selecting circuit 94 and outputs the data to the counter register 91.

As described above, by counting up only states in which the operation-processing effective-state signal RSN is active and sync-clearing a counted value in accordance with a signal obtained by calculating the AND between the count matching signal EQU and operation-processing effective-state signal RSN, it is possible to set a counting cycle to a selected RSN cycle.

In a conventional timer, when controlling the timer or reading an operation result, it is necessary to sync-adjustment the source clock SCK and frequency-dividing clock RCK because there is a signal shift between the clocks SCK and RCK, and therefore a response is decreased. As opposed to this, in the timer shown in FIG. 9, however, because every operation is performed in accordance with the source clock SCK, a sync-adjusting portion is unnecessary and the response is not decreased even when reading a control signal or operation result of the timer.

Figure 11:
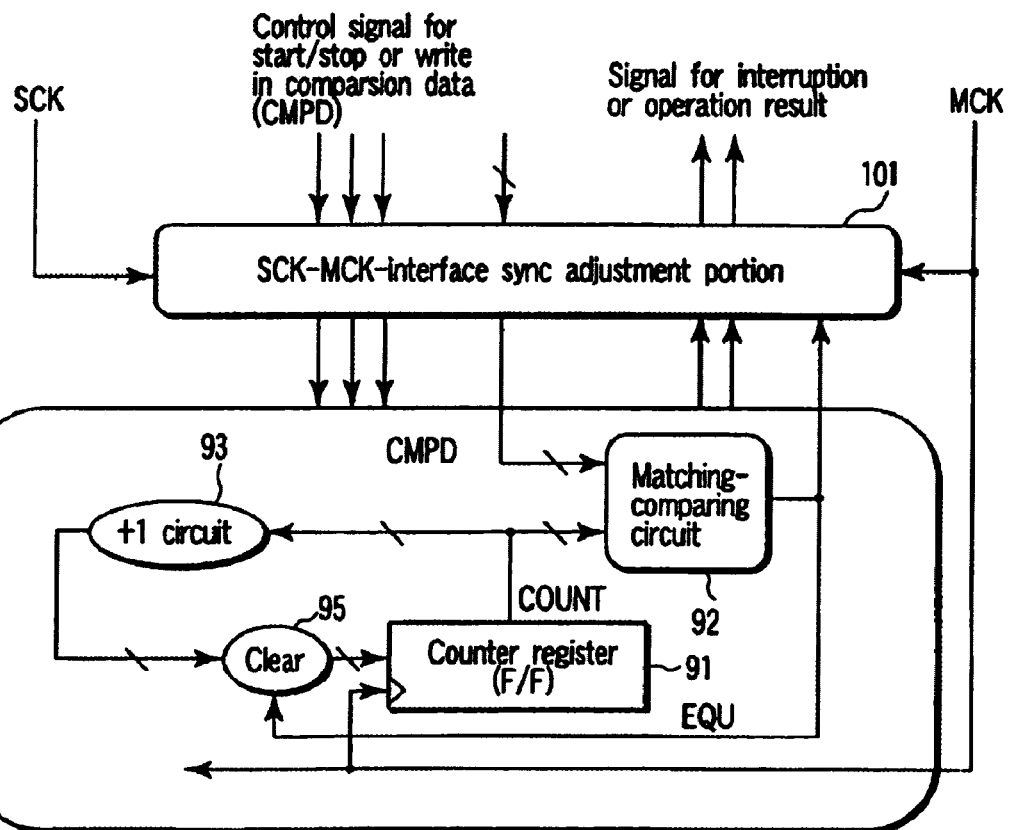
FIG. 11 is a block diagram showing a schematic configuration of a conventional timer.
Figure 10:
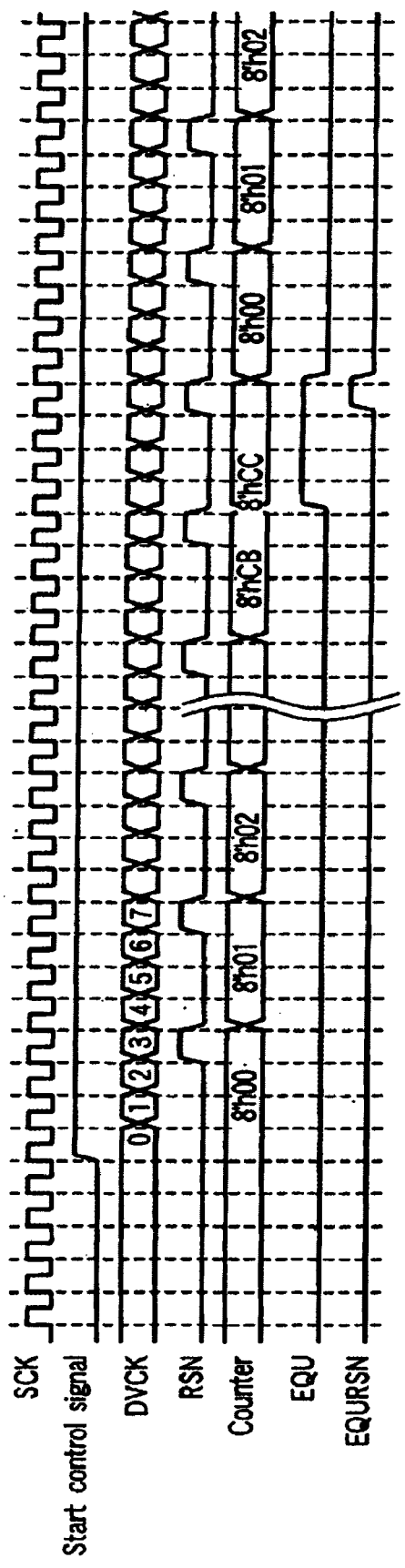
FIG. 10 is an illustration showing an operation timing chart of the timer shown in FIG. 9.
Figure 12:
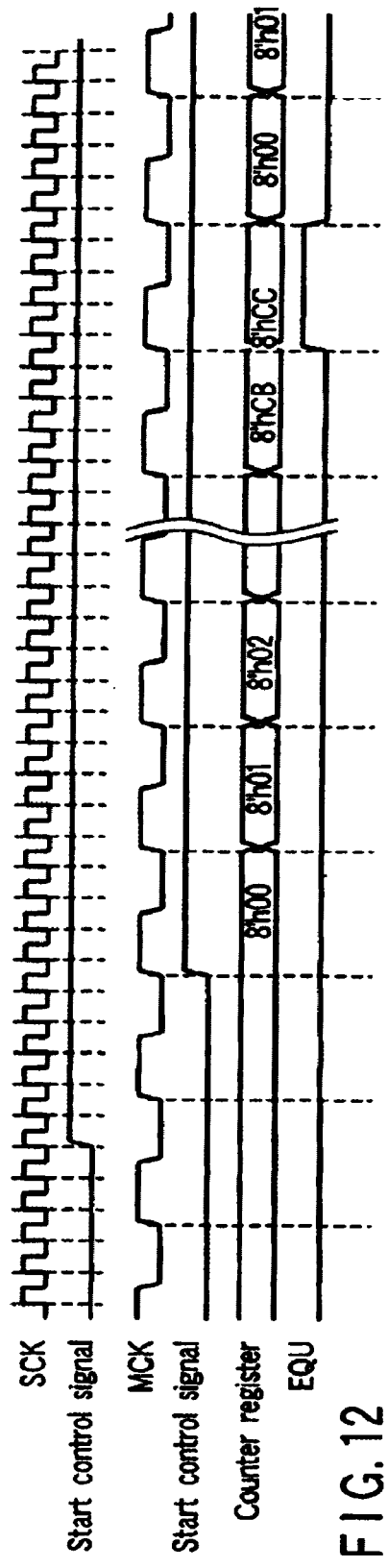
FIG. 12 is an illustration showing an operation timing chart of the timer shown in FIG. 11.
Figure 13:
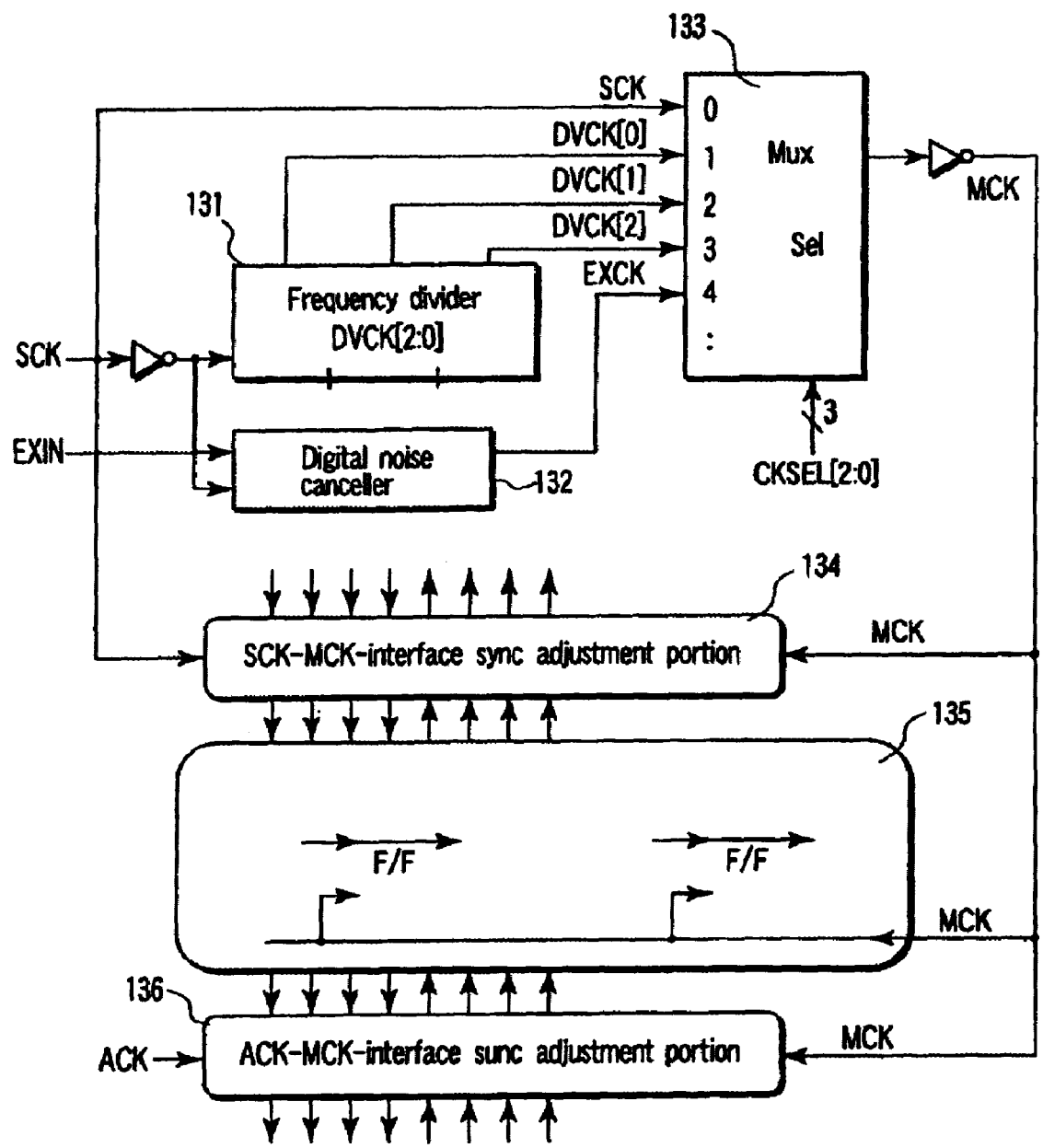
FIG. 13 is a block diagram showing a schematic configuration of a conventional one-chip microcomputer.
Figure 14:
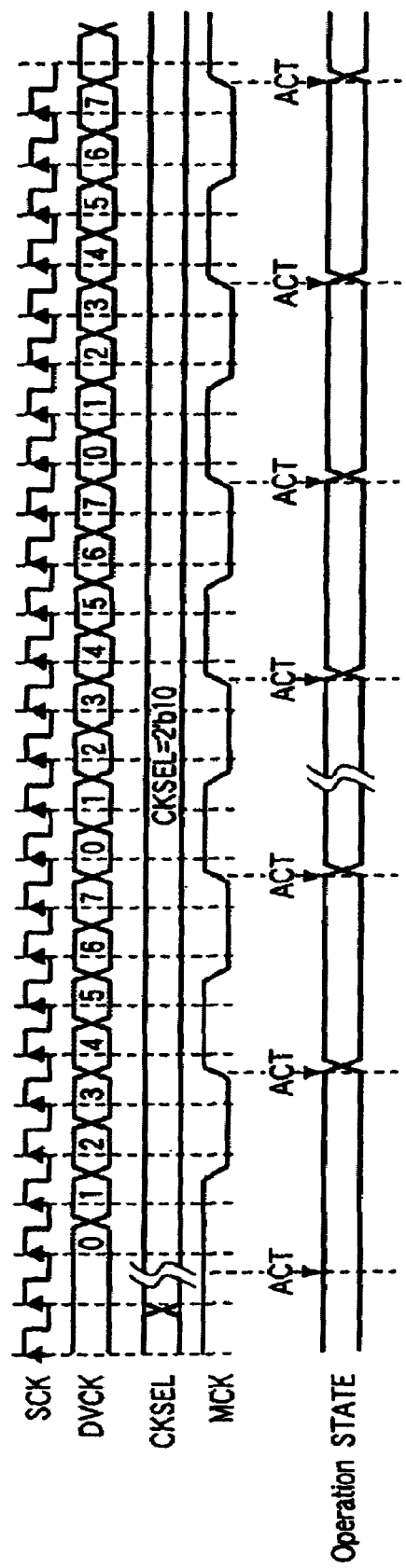
FIG. 14 is an illustration showing an operation timing chart when selecting ¼ of the source clock SCK as an operating frequency of the integrated circuit portion 135.

FIG. 10 shows an operation timing chart of the above timer. Moreover, FIG. 11 shows a block diagram of a conventional timer. FIG. 12 shows an operation timing chart of a conventional timer. The operation timing charts of timers shown in FIGS. 10 and 12 show a case in which the comparison data signal CMPD is "8'hcc". In FIG. 11, a portion same as that in FIG. 10 is provided with the same numeral and its detailed description is omitted. In FIG. 11, numeral 100 denotes a timer and numeral 101 denotes an adjusting portion of sync of the interface between SCK and MCK.

Timer shown in this embodiment immediately operates when a start control signal becomes active independently of the operation-processing effective-state signal RSN. Therefore, the response to the start control signal is not decreased.

A conventional timer operates depending on MCK. Therefore, as shown in FIG. 12, there is a time lag by the time the timer operates after the start control signal becomes active and the response is decreased.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor circuit device comprising:
a synchronous frequency divider which counts input clock signals and outputs a counted value;
a selector circuit which receives signals of bits of the counted value output from the synchronous frequency divider and outputs a carry look-ahead signal of predetermined bits as an operation-processing effective-state signal in accordance with a selector signal; and
an integrated circuit portion which uses the input clock signals input to the synchronous frequency divider as a source clock signal and whose operating frequency is switched in accordance with the operation-processing effective-state signal,
wherein the integrated circuit portion comprises an operating-frequency selection circuit which transfers a predetermined signal while the operation-processing effective-state is active.

2. The semiconductor circuit device according to claim 1, further comprising:
an edge detection circuit which detects the edge of a signal obtained by canceling digital noises of an external signal in accordance with the clock signal input to the synchronous frequency divider and outputs a signal which becomes active for one cycle of the source clock signal as a detection signal; wherein
the selector circuit outputs a signal output from the edge detection circuit as an operation-processing effective-state signal in accordance with the selector signal.

3. The semiconductor circuit device according to claim 1, wherein the integrated circuit portion is a synchronous counter which performs counting while the operation-processing effective-state signal is active.

4. The semiconductor device according to claim 1, wherein the selector circuit includes a logic circuit to generate the carry look-ahead signal based on the signals of predetermined bits of the counted value.

5. The semiconductor device according to claim 1, wherein the integrated circuit portion includes a shift register configured by registers serially connected to each other, wherein the shift register transfers the predetermined signal while the operation-processing effective-state is active and transfers output signals of the registers in response to the source clock signal while the operation-processing effective-state is inactive.

6. The semiconductor device according to claim 5, wherein the integrated circuit portion further comprises a noise canceller.

7. A semiconductor circuit device comprising:
a synchronous frequency divider which counts input clock signals and outputs a counted value;
a selector circuit which outputs a comparison result between the counted value by the frequency divider and a set value as an operation-processing effective-state signal; and
an integrated circuit portion which uses the input clock signals input to the synchronous frequency divider as a source clock signal and whose operating frequency is switched in accordance with the operation-processing effective-state signal,
wherein the integrated circuit portion comprises an operating-frequency selection circuit for transferring a predetermined signal while the operation-processing effective-state signal is active.

8. The semiconductor circuit device according to claim 7, further:
an edge detection circuit which detects the edge of a signal obtained by canceling digital noises of an external signal in accordance with the clock signal input to the synchronous frequency divider and outputs a signal which becomes active for one cycle of the source clock signal as a detection signal, wherein
the selector circuit outputs a signal output from the edge detection circuit as an operation-processing effective-state signal in accordance with the selector signal.

9. The semiconductor circuit device according to claim 7, wherein the integrated circuit portion is a digital noise canceller which performs sampling while the operation-processing effective-state signal is active.

10. The semiconductor circuit device according to claim 7, wherein the integrated circuit portion is a synchronous counter which performs counting while the operation-processing effective-state signal is active.

11. The semiconductor device according to claim 7, wherein the selector circuit includes a plurality of detecting circuits, each of the detecting circuits detects a number of bits of the counted value output from the synchronous frequency divider and output signals when each of the detecting circuit detects a predetermined number of bits.

12. The semiconductor device according to claim 7, wherein the integrated circuit portion includes a shift register configured by registers serially connected to each other, wherein the shift register transfers the predetermined signal while the operation-processing effective-state is active and transfers output signals of the registers in response to the source clock signal while the operation-processing effective-state is inactive.

* * * * *